(12) United States Patent
Shi et al.

(10) Patent No.: US 9,246,443 B2
(45) Date of Patent: Jan. 26, 2016

(54) MULTI-MODE POWER AMPLIFIER

(71) Applicant: Skyworks Solutions, Inc, Woburn, MA (US)

(72) Inventors: Ying Shi, Saratoga, CA (US); Jinghang Feng, Santa Clara, CA (US)

(73) Assignee: Skyworks Solutions, Inc, Woburn, MA (US)

( * ) Notice: Subject to any disclaimer, the term of this patent is extended or adjusted under 35 U.S.C. 154(b) by 0 days.

(21) Appl. No.: 14/091,155

(22) Filed: Nov. 26, 2013

(65) Prior Publication Data

US 2015/0148095 A1 May 28, 2015

(51) Int. Cl.
| | |
|---|---|
| *H01Q 11/12* | (2006.01) |
| *H03F 1/56* | (2006.01) |
| *H03F 3/24* | (2006.01) |
| *H03F 3/21* | (2006.01) |
| *H03F 3/19* | (2006.01) |
| *H04W 52/02* | (2009.01) |
| *H04W 88/06* | (2009.01) |

(52) U.S. Cl.
CPC .. *H03F 1/56* (2013.01); *H03F 3/19* (2013.01); *H03F 3/211* (2013.01); *H03F 3/245* (2013.01); *H04W 52/028* (2013.01); *H04W 52/0229* (2013.01); *H03F 2200/12* (2013.01); *H03F 2200/451* (2013.01); *H03F 2203/21103* (2013.01); *H03F 2203/21131* (2013.01); *H04W 88/06* (2013.01)

(58) Field of Classification Search
CPC ...... H03G 3/3042; H03G 3/22; H04W 88/06; H03F 1/302
USPC .................. 455/127.3, 253.2, 552.1; 330/297
See application file for complete search history.

(56) References Cited

U.S. PATENT DOCUMENTS

| | | | |
|---|---|---|---|
| 2004/0108901 A1* | 6/2004 | Apel et al. | 330/285 |
| 2007/0222520 A1* | 9/2007 | Inamori et al. | 330/289 |
| 2010/0210299 A1* | 8/2010 | Gorbachov | 455/552.1 |
| 2011/0298545 A1* | 12/2011 | Morimoto et al. | 330/296 |

* cited by examiner

*Primary Examiner* — Danh Le
(74) *Attorney, Agent, or Firm* — Knobbe, Martens, Olson & Bear, LLP

(57) ABSTRACT

A power amplifier module that includes a power amplifier and a controller is presented herein. The power amplifier module may include a set of transistor stages and a plurality of bias circuits. At least one transistor stage from the set of transistor stages may be in electrical communication with a first bias circuit and a second bias circuit from the plurality of bias circuits. The first bias circuit can be configured to apply a first bias voltage to the at least one transistor stage and the second bias circuit can be configured to apply a second bias voltage to the at least one transistor stage. The controller may be configured to activate one of the first bias circuit and the second bias circuit.

22 Claims, 5 Drawing Sheets

MULTI-MODE POWER AMPLIFIER

TECHNICAL FIELD

The present disclosure relates generally to power amplifiers. More specifically, the present disclosure relates to power amplifiers capable of operating in multiple bias modes.

BACKGROUND

Portable communication devices, such as cellular telephones, typically use one or more power amplifiers to amplify an information signal prior to transmission. Modern communications systems often use both phase and amplitude modulation to boost information transmission rates, generally at the expense of power consumption. Often, a linear power amplifier is used for systems that use phase and amplitude modulation (such as systems that employ code division multiple access (CDMA) or enhanced data rates for GSM evolution (EDGE)), while a non-linear power amplifier is used for systems that employ phase only modulation (e.g., a constant envelope modulation system such as Gaussian mean shift keying (GMSK) modulation).

Typically, a device is designed to use either a linear power amplifier or a non-linear power amplifier based on the type of communication network for which the device is being designed. The power amplifier is usually implemented as one or more stages of transistors and related circuitry. In most applications, the operating point of the power amplifier is set by providing a bias current or voltage to at least one of the terminals of at least one of the stages of the power amplifier. In the case of a bipolar junction transistor (BJT) the bias current is normally applied to the base terminal of the transistor to control how the transistor will conduct between its collector and emitter terminals. In a typical implementation, the power amplifier comprises one or two driver stages followed by an output stage.

SUMMARY

In accordance with some embodiments, the present disclosure relates to a power amplifier module that includes a power amplifier and a controller. The power amplifier module may include a set of transistor stages and a plurality of bias circuits. At least one transistor stage from the set of transistor stages may be in electrical communication with a first bias circuit and a second bias circuit from the plurality of bias circuits. The first bias circuit can be configured to apply a first bias voltage to the at least one transistor stage and the second bias circuit can be configured to apply a second bias voltage to the at least one transistor stage. The controller may be configured to activate one of the first bias circuit and the second bias circuit.

In some cases, the first bias circuit is associated with a first impedance and the second bias circuit is associated with a second impedance. Further, in some instances, the first bias circuit causes the power amplifier to operate in a saturated mode when the first bias circuit is activated. The controller may be further configured to activate the first bias circuit by applying a voltage to the first bias circuit. This voltage supplied to the first bias circuit may be based at least in part on a voltage received at the controller.

In certain embodiments, the second bias circuit causes the power amplifier to operate in a linear mode when the second bias circuit is activated. The controller may be further configured to activate the second bias circuit by applying a current to the second bias circuit. This current supplied to the second bias circuit may be based at least in part on a voltage received at the controller.

With some implementations, the controller may be further configured to select between the first bias circuit and the second bias circuit to activate based on a mode selection signal received at the controller. This mode selection signal may be based at least partially on a signal received from a wireless network. Further, the controller may be configured to deactivate the first bias circuit by floating an input to the power amplifier associated with the first bias circuit.

In some embodiments, the power amplifier includes a current sense mirror configured to provide a current from at least one stage of the set of transistor stages to the controller. The controller may be further configured to select a voltage to apply to the first bias circuit based at least in part on the current received from the current sense mirror. In some instances, each transistor stage from the set of transistor stages corresponds to a pair of bias circuits from the plurality of bias circuits. The pair of bias circuits may include a bias circuit configured to cause the power amplifier to operate in a saturated mode when active and a bias circuit configured to operate in a linear mode when active. Moreover, the plurality of bias circuits may include a third bias circuit and a fourth bias circuit. The third bias circuit may be configured to apply a different bias voltage than the first bias circuit and the fourth bias circuit may be configured to apply a different bias voltage than the second bias circuit. The third bias circuit and the fourth bias circuit may be in electrical communication with a different transistor stage from the set of transistor stages than the first bias circuit and the second bias circuit.

In certain embodiments of the present disclosure, a method is presented for controlling a power amplifier. The method may include receiving a first voltage at a controller of a power amplifier and receiving a mode selection signal at the controller. Further, the method may include determining based at least in part on the mode selection signal whether the power amplifier is to operate in a saturation operation state or a linear operation state. In response to determining that the power amplifier is to operate in the saturation operation state, the method may include generating a second voltage and providing the second voltage to a first bias circuit of the power amplifier.

In some embodiments, in response to determining that the power amplifier is to operate in the linear operation state, the method may further include generating at least one current and providing the at least one current to a second bias circuit of the power amplifier. The at least one current may be generated based at least in part on the first voltage. Moreover, in response to determining that the power amplifier is to operate in the linear operation state, the method may include floating the first bias circuit. In some cases, the second voltage is generated based at least in part on the first voltage.

In certain embodiments of the present disclosure, a wireless device is presented that includes a transceiver configured to process radio frequency (RF) signals. Further, the wireless device may include an antenna in communication with the transceiver. This antenna may be configured to facilitate communicating with a wireless network. Moreover, the wireless device may include a power amplifier module that may include a power amplifier and a controller. The power amplifier may include a set of transistor stages and a plurality of bias circuits. At least one transistor stage from the set of transistor stages may be in electrical communication with a first bias circuit and a second bias circuit from the plurality of bias circuits. The first bias circuit may be configured to apply a first bias voltage to the at least one transistor stage and the second bias circuit may be configured to apply a second bias voltage to the at least one transistor stage. Further, the controller may be configured to activate one of the first bias circuit and the second bias circuit.

In some cases, the controller may select one of the first bias circuit and the second bias circuit to activate based at least in part on a signal received from the transceiver. Alternatively, or in addition, the controller may select one of the first bias circuit and the second bias circuit to activate based at least in part on a type of the wireless network.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION

Introduction

Figure 1:
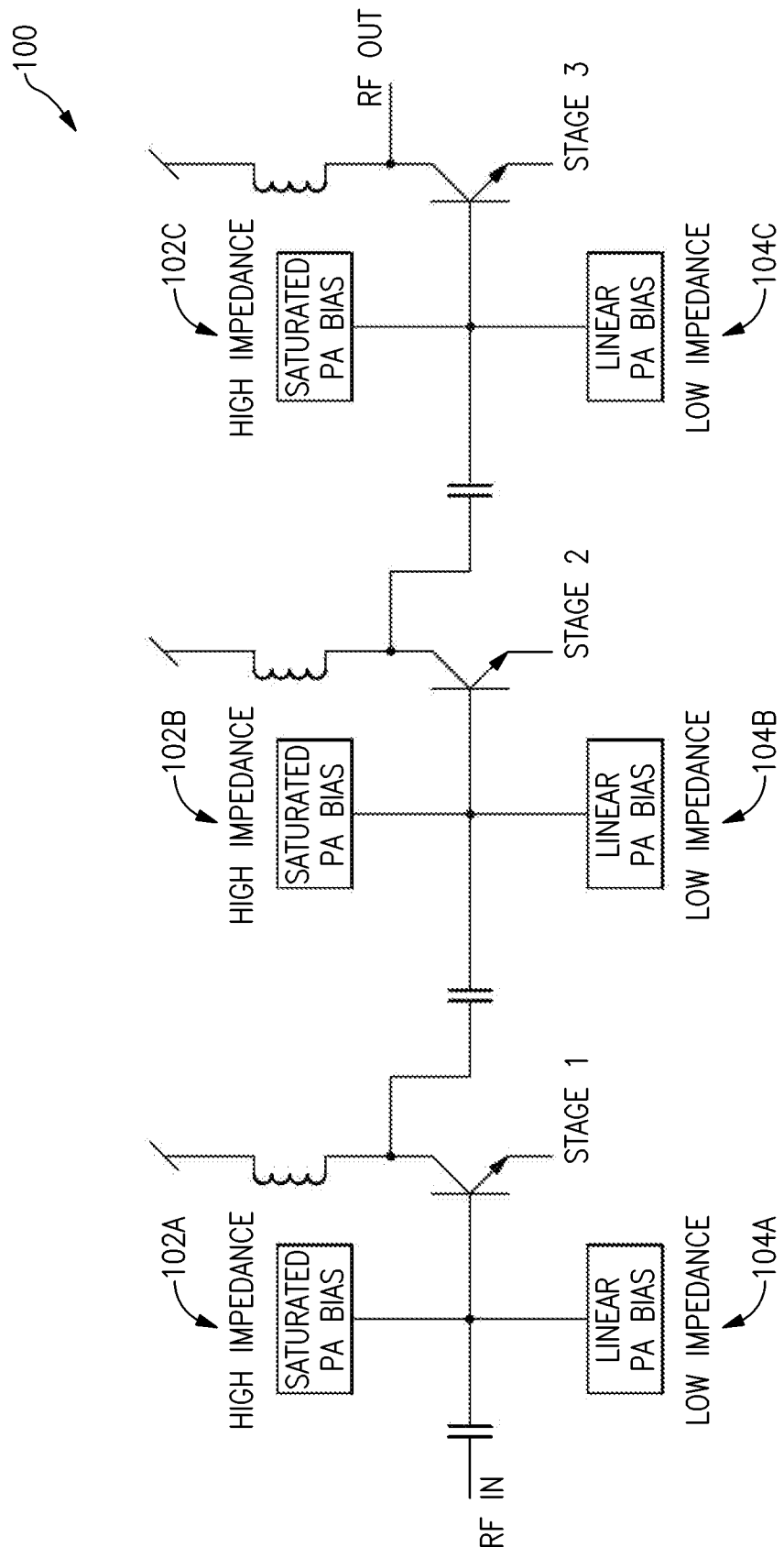
FIG. 1 illustrates a block diagram of an embodiment of a multi-mode power amplifier that supports multiple bias modes.

Power amplifiers are used for a number of applications. One such application is for wireless communications. Power amplifiers used with wireless devices are generally configured differently based on the type of wireless network on which the wireless device is intended to operate. For example, a wireless device may be configured to operate on a 2G-based network or a Global System for Mobile Communications (GSM) based network. Alternatively, or in addition, a wireless device may be configured to operate on 2.5G network, such as an Enhanced Data rates for GSM Evolution (EDGE) based network, a 3G, a 4G, a 4G-LTE, or other type of communication network.

Often, although not necessarily, a wireless device designed to operate on a 2G-based network uses a saturated power amplifier (PA). A saturated PA may be used because the envelope of a signal transmitted/received on a 2G-based network is generally not modulated. However, a wireless device designed to operate on newer networks, such as 2.5G (an EDGE network), 3G, etc., will often include a linear PA. A linear PA may be used because with many communication networks subsequent to 2G networks the envelope for transmitted/received signals includes information.

Despite the configuration of many newer communication networks requiring or making the use of a linear PA preferable, this may not be the case for some communication networks. Further, many communication companies utilize multiple communication networks. For example, a communications provider may utilize a 3G or 4G network for data packets, but may use a 2G network for voice packets. Moreover, some parts of the world have not upgraded from 2G communication networks to newer networks. As a result, many wireless devices are designed to function with multiple communication networks including networks that do not modulate a signal envelope and networks that do modulate the signal envelope to, for example, include information in the envelope. In some networks, information may be included by modulating the envelope or by modulating the phase of the signal. For example, in many 2G networks, information is included in a signal by phase modulation rather than amplitude modulation. As a result, a saturated power amplifier, or a power amplifier operating in a saturated region, may be used with devices configured to operate on 2G networks. In contrast, in many 2.5G or 3G networks, information is included in a signal via amplitude modulation. As a result, a linear power amplifier, or a power amplifier operating in a linear mode is often used for devices configured for use with 2.G or 3G networks.

One solution that enables wireless devices to function with different networks is to use, among other devices, PAs that support both a saturated mode and a linear mode. However, the challenge of designing such a PA is that the design requirements for a saturated mode and a linear mode PA are different.

Saturated PA can be categorized into two groups, voltage saturation PAs and current saturation PAs. In certain embodiments, current saturation PAs advantageously do not require a Low Dropout regulator and thus it can be implemented with a lower cost and a higher efficiency. Thus, it is highly desirable to develop a PA that uses current saturation method in the saturated mode, while the same PA can also support the linear mode operation. Some examples of saturated power amplifiers that may be used with certain embodiments described herein are described in U.S. Pat. No. 6,734,729, which is hereby incorporated by reference in its entirety herein.

One challenge in designing a PA is the conflicting requirement for the impedance of the bias circuit in the saturated mode and linear mode. It is often desirable if not required to use a high impedance bias when the PA is in a saturated mode and a low impedance bias when the PA is in a linear mode. One solution is to include multiple bias circuits that have different levels of impedance. A particular bias circuit corresponding to a specific operating mode may be activated, and the remaining bias circuits may be deactivated. However, the deactivated bias circuits can sometimes introduce parasitic effects that can reduce the effectiveness of the PA and that can make designing the PA more challenging.

Advantageously, embodiments described herein present a multimode PA utilizing a current saturation architecture that facilitates supporting multiple bias circuits. Further, embodiments herein reduce and/or eliminate the parasitic effect of the inactive bias circuit on the PA. Moreover, a number of embodiments described herein present a multimode PA utilizing a modified current saturation architecture that includes a current sense mirror device. Advantageously, in certain embodiments, the sense mirror may more accurately measure the current of an output transistor included in the PA thereby enabling improved control of the PA.

Example Multi-Mode Power Amplifier

FIG. 1 illustrates a block diagram of an embodiment of a multi-mode power amplifier 100 that supports multiple bias modes. The power amplifier 100 may include a number of stages. In the example of FIG. 1, the power amplifier 100 is a three-stage amplifier that includes three transistor stages, stage 1, stage 2, and stage 3. These stages may also be referred to as S1, S2, and S3. Further, in some cases, the final stage, which is S3 in the example of FIG. 1, may be referred to as the output stage or output array. However, the power amplifier 100 is not limited as such and may include more or less transistor stages. The transistors of the stages S1, S2, and S3 in FIG. 1 represent bipolar junction transistors (BJT). However, this disclosure is not limited as such and any type of transistor may be used. For example, the transistors may be Field Effect Transistors (FETs), such as Junction FETs (JFETs) or Metal-Oxide-Semiconductor FETs (MOSFETs).

One or more of the transistor stages may include a pair of bias circuits that electrically communicate with the base of the transistor for the transistor stage. For instance, as illustrated in FIG. 1, stage 1 is in electrical communication with bias circuits 102A and 104A, stage 2 is in electrical communication with bias circuits 102B and 104B, and stage 3 is in electrical communication with bias circuits 102C and 104C. In some embodiments where FETs are used in place of the BJT transistors of FIG. 1, the pairs of bias circuits may be in electrical communication with the gates of the transistors. Although FIG. 1 illustrates each pair of bias circuits being connected to the base of the transistors, in some cases other devices and/or circuitry may be in electrical communication between the bias circuits and the transistors. Thus, while the bias circuits of FIG. 1 are in direct electrical communication with the transistors, in other cases the bias circuits may not be directly connected to the transistors. For example, in some cases, a resistor may be located between one or more of the bias circuits and the transistors. As a second example, a switch may be located between one or more of the bias circuits and the transistors.

The bias circuits 102A-102C are configured to have high output impedance to facilitate the PA 100 to properly function in a saturation mode or a saturation state. In contrast, the bias circuits 104A-104C are linear bias circuits configured to have low output impedance to facilitate the PA 100 to properly function in a linear mode or a linear state. The bias circuits 102A-102C generally create a higher impedance level compared to the impedance of the bias circuits 104A-104C. For example, the impedance of bias circuit 102C can be 10 times that of bias circuit 104C. Generally, only one of the bias circuits for each transistor is active at a time, and generally, it is the same bias circuit type for each transistor that is active. For example, when the power amplifier 100 is operating in a saturated mode, the bias circuits 102A-102C may be active, and the bias circuits 104A-104C may be inactive. This may occur when the wireless device that includes the power amplifier 100 is using a 2G communication network. In contrast, when the power amplifier 100 is operating in a linear mode, the bias circuits 102A-102C may be inactive, and the bias circuits 104A-104C may be active. This may occur when the wireless device that includes the power amplifier 100 is using, for example, a 2.5G or 3G communication network.

In some cases, at least some, if not all, of the bias circuits 102A-102C may be instances of the same circuit. Further, in some cases, at least some, if not all, of the bias circuits 102A-102C may differ from each other. Similarly, at least some, if not all, of the bias circuits 104A-104C may be instances of the same circuit or may differ from each other. Some non-limiting examples of designs for the bias circuits are described in more detail below with respect to FIG. 2 and FIG. 3. Further, an example of a wireless device that may use the PA 100 is described with respect to FIG. 5.

As illustrated, the bias circuits 102A-102, 104A-104C may be included as part of the PA 100. However, in some embodiments, the bias circuits may be external to the PA. In some such cases, the bias circuits may communicate with the PA via one or more inputs (e.g., pins, solder balls, etc.).

The PA 100 may receive a signal to be amplified at the RFin to the PA 100. This signal may be received from a number of sources including an antenna, a baseband subsystem, a transceiver, etc. Once the signal is amplified, it may be output via the RFout.

Example Bias Circuits

Figure 2:
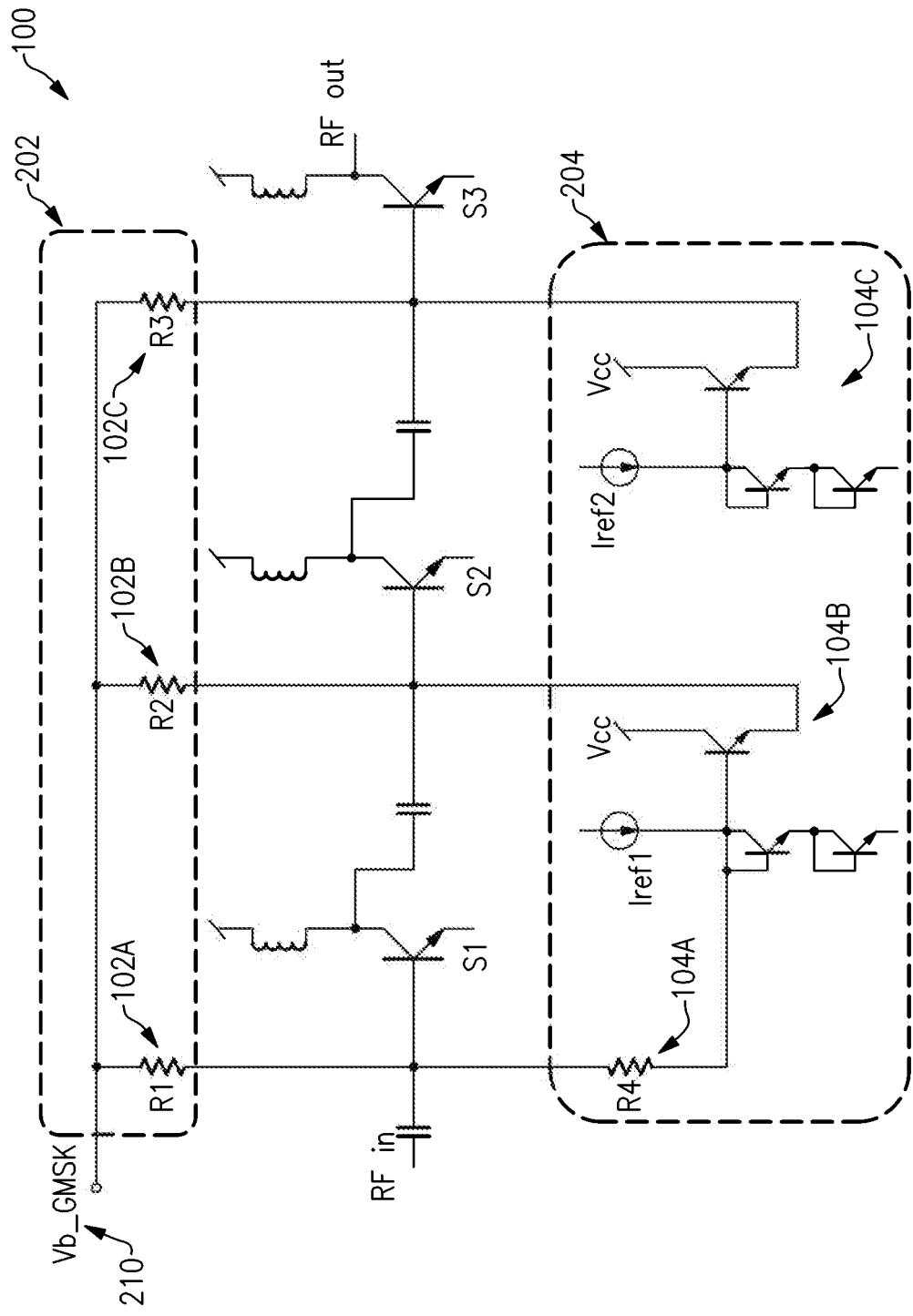
FIG. 2 illustrates an embodiment of a multi-mode power amplifier that supports multiple bias modes.

FIG. 2 illustrates an embodiment of a multi-mode power amplifier 100 that supports multiple bias modes. As previously described, the power amplifier 100 may include a set of bias circuits designed to cause the PA 100 to function in a saturated mode. These bias circuits, collectively bias circuits 202, include the bias circuits 102A-102. The bias circuits 102A-102C each include a resistor R1-R3, respectively. Typically, the values of R1, R2, and R3 differ. Often, the resistors R1, R2, and R3 are inversely scaled according to the size of the corresponding amplifier stage in communication with the resistor. For example, in cases where the transistor S3 is the largest of the three transistors S1, S2, and S3, the resistor R3 may be the smallest of the resistors R1, R2, and R3.

A voltage may be supplied to the bias circuits 202 via voltage input 210. Whether the voltage is supplied may be determined based on the mode in which the PA 100 is operating. This determination may be made by a controller (not shown), which is described in further detail with respect to FIG. 3. Further, in some cases, the controller may determine the voltage value to supply. When the PA 100 is functioning in saturated mode, the voltage may be applied to the voltage input 210. When the PA 100 is not functioning in the saturated mode, the voltage input 210 may be floated by disconnecting it from a voltage source. Alternatively, the voltage input 210 may be tied to ground. Floating the voltage input 210 or setting the voltage input 210 to ground may be accomplished through the use of a switch (not shown) and/or via the controller.

In addition to the bias circuits 202, the PA 100 may include the bias circuits 104A-104C, collectively bias circuits 204. The bias circuits 204 may be configured to cause the PA 100 to function in a linear mode. Generally, the resistances selected for the resistors R1-R3 are selected for the PA 100 to function in a saturated mode. However, the resistances that work well for saturated mode often do not work well for when the PA 100 is functioning in a linear mode as the impedance is usually too high. Thus, the bias circuits 204 will often be associated with a lower impedance than the bias circuits 202.

As illustrated in FIG. 2, some of the bias circuits may be configured differently from other bias circuits. The bias circuit 104A includes a resistor R4, which generates a lower impedance than the resistor R1. Further, the bias circuits 104B and 104C include a set of transistors and a current source Iref1 and Iref2, respectively. The current sources Iref1 and Iref2 may be activated when the PA 100 is functioning in a linear mode. Further, when the PA 100 is functioning in a saturated mode, the current sources Iref1 and Iref2 may be deactivated.

One challenge that has prevented the development of a multi-mode PA using a current saturation architecture is the parasitic effect caused by the deactivated bias circuits on the PA 100. For example, when the PA 100 is functioning in a linear mode, the saturated mode bias circuits may introduce a parasitic effect that can impact operation of the PA. This parasitic effect may be caused, for example, by a current from the base of the transistors. Conversely, when the PA 100 is functioning in a saturated mode, the linear mode bias circuits may introduce a parasitic effect that can impact operation of the PA.

A solution to the parasitic effect is to float the voltage input 210 when the PA 100 is not operating in a saturated mode. The voltage input 210 can be floated by opening a switch that connects a voltage source to the voltage input 210. Alternatively, instead of floating the voltage input 210, the voltage input 210 can be grounded and the current from the current sources Iref1 and Iref2 can be increased to compensate for current that may leak from the transistor bases to the resistors R1-R3.

When the PA 100 is operating in a saturated mode, the inclusion of two transistors as part of the linear mode bias circuits (e.g., bias circuits 104B, 104C) prevents the parasitic effect from impacting the operation of the PA 100. The base of the transistors S1-S3 generally does not have a high enough leakage voltage to cause multiple transistors in the bias circuits 104B and 104C to activate.

Additional Example Multi-Mode Power Amplifiers

Figure 3:
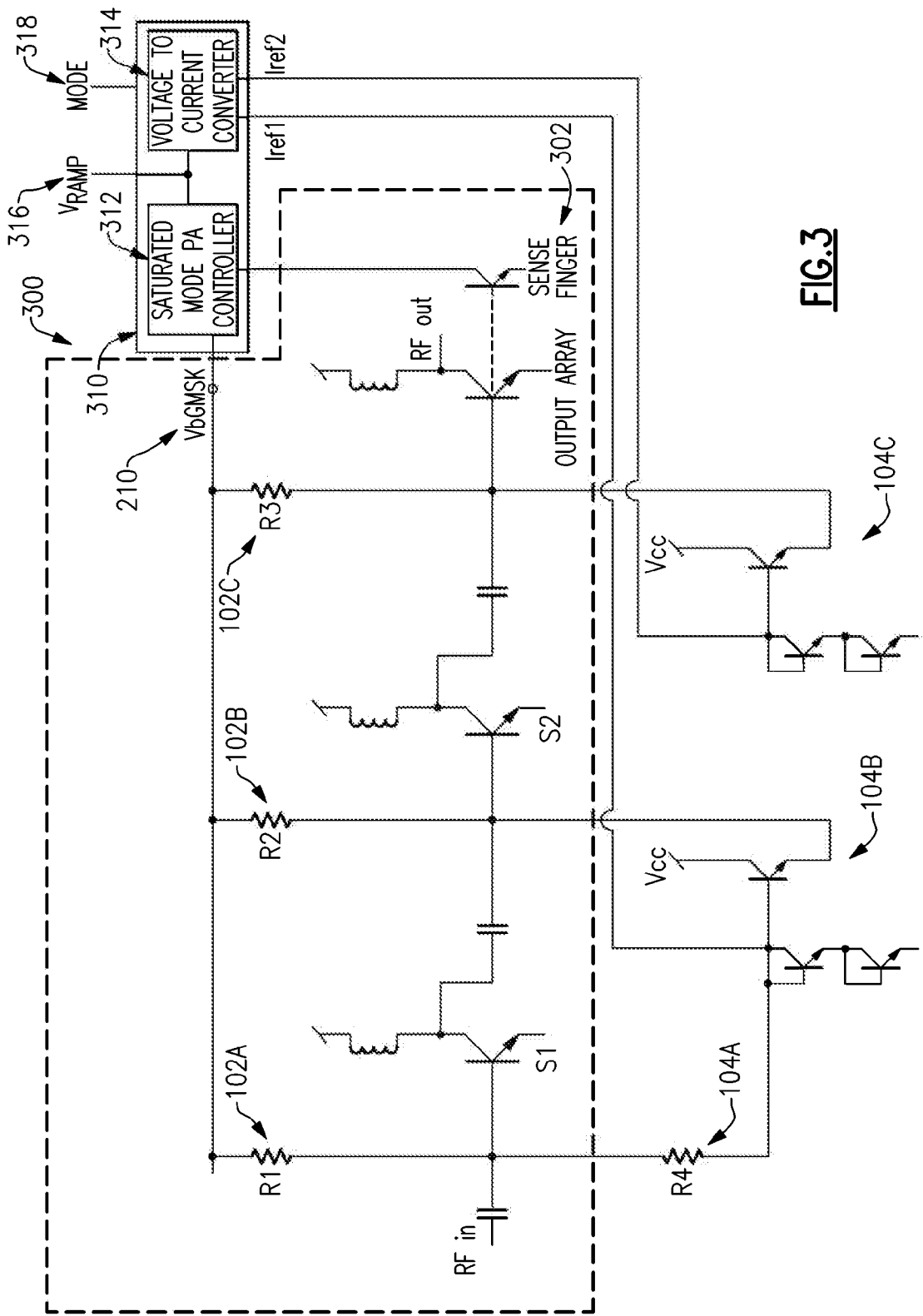
FIG. 3 illustrates an embodiment of another multi-mode power amplifier that supports multiple bias modes.

FIG. 3 illustrates an embodiment of another multi-mode power amplifier 300 that supports multiple bias modes. The multi-mode power amplifier 300 includes a number of the features of the multi-mode power amplifier 100 as indicated by the reuse of reference numerals. As with the multi-mode power amplifier 100, the multi-mode power amplifier 300 may include a number of transistor stages. As indicated in FIG. 3, the final transistor stage may sometimes be referred to as the output array, which provides the output signal to the RFout.

As previously mentioned, the PA 100 may be based on a current saturation architecture. The PA 300 may be based on a modified current saturation architecture that includes a sense mirror device 302. This modified current saturation architecture may be referred to as a sense mirror based current saturation architecture. As depicted in FIG. 3, the current sense mirror 302 may be a BJT transistor that is configured to read, or sense, a current from the output array of PA 300. The dashed line between the output array and the current sense mirror 302 represents the "sensing" action of the current sense mirror 302 rather than a physical connection. Some example embodiments of the current sense mirror in electrical communication with the output array are described below with further reference to FIG. 4.

In some cases, the current sense mirror 302 is used or operational when the PA 300 is operating in saturation mode (e.g., when the wireless device is operating on a GSM network) and is nonoperational, disconnected, or is ignored when the PA 300 is operating in linear mode (e.g., when the wireless device is operating on an edge network). The idea that, in some cases, the current sense mirror 302 is used only when the PA 300 operates in a saturated mode is indicated by the dashed line box that includes the current sense mirror 302 and the bias circuits 102A-102C while excluding the bias circuits 104A-104C, which are used when the PA 300 operates in a linear mode. In other embodiments, the current sense mirror 302 may be utilized in either operating mode of the PA 300. Further, although excluded from the dashed line box, in some cases, the current mode controller 312 may be included as part of the PA 300. Further, the current mode controller 312 may, in some cases, supply a voltage only when the PA 300 is operating in a saturation mode. In some such cases, the current mode controller 312 may, at least conceptually, be included within the dashed line box regardless of whether the current mode controller 312 is included with the PA 300 or is part of a separate die.

In some embodiments, the current sense mirror 302 may include a sense resistor (not shown), which can be used to convert the finger current or sensed current from the finger array into a voltage, or sensed voltage. The sense current and/or voltage may be provided to the PA controller 310. Thus, one or more of the sense current and the sense voltage may be used by the PA controller 310 to facilitate control of the PA 300 as part of a feedback loop.

Although the current sense mirror 302 is illustrated as a BJT transistor, it is not limited as such. The current sense mirror 302 may include one or more devices or components that may be used to provide feedback from the PA to the controller. For example, the current sense mirror 302 may include a MOSFET transistor or a resistor. Typically, the feedback is a current signal from the output array. However, the feedback is not limited as such. For example, in some cases, the feedback may include a combination of the current from the output array and a current from an earlier stage (e.g., S2) of the PA 300. In certain embodiments, the current sense mirror 302 may indirectly manage the current of the output array by, for example, affecting the voltage applied at the voltage input 210 based at least partially on feedback from the output array. Advantageously, in certain embodiments, the current sense mirror 302 enables the PA 300 to be controlled more precisely compared to the PA 100, which excludes a current sense mirror.

Additional examples of using feedback to facilitate control of a power amplifier is disclosed in U.S. Pat. No. 6,734,729, filed Mar. 30, 2002, which is hereby incorporated by reference in its entirety herein.

The PA 300 may communicate with and/or be controlled by the PA controller 310. The PA controller 310 may be part of a separate die or package. Alternatively, the PA controller 310 may be on the same die as the PA 300 or included in the same package. In yet other embodiments, the PA controller 310 may, at least in part, be included as part of the PA 300. For example, the saturated mode PA controller 312 may be included as part of the PA 300 while the voltage to current converter 314 may be separate from the PA 300. In some cases, the saturated mode controller 312 and the voltage to current converter 314 may each be or may each be part of separate controllers, which may or may not be included as part of the PA 300.

The current mode controller 312 can supply a voltage signal to the voltage input 210. In some cases, the voltage signal is supplied when the PA 300 is operating in a saturation or GSM mode. When the PA 300 is operating in a linear or EDGE mode, the voltage signal may not be supplied. Instead, the current mode controller 312 may ground the voltage input 210 or float the voltage input 210 by, for example, opening a switch (not shown).

When a voltage is supplied to the voltage input 210, the voltage value may be based, at least in part, on a Vramp signal supplied at the Vramp input 316, a sense signal provided by the current sense mirror 302, or a combination of the two. For example, the voltage supplied to the voltage input 210 may initially be related to the Vramp signal. Over time, the voltage supplied to the voltage input 210 may be modified up or down based on a signal from the current sense mirror 302, which may be based on a current of the output array. The Vramp signal may be supplied to the controller 310 by a number of systems that can be involved in the control and/or setting of the PA 300. For example, the Vramp signal may be supplied by a transceiver or baseband subsystem. In other cases, the Vramp signal may be provided by a power supply or power management system.

The voltage to current converter 314 may be configured to convert the received Vramp signal into one or more current signals. These current signals may act as the current sources Iref1 and Iref2 of FIG. 2. In the example of FIG. 3, the current sources Iref1 and Iref2 are included as part of the voltage to current converter 314 with the current generated or converted by the sources being supplied to the Iref1 and Iref2 lines illustrated in FIG. 3. In some cases, the value of the Iref1 and Iref2 current sources, or the currents supplied to the Iref1 and Iref2 lines, may be based on the Vramp signal supplied to the Vramp input 316. To simplify discussion, and not to limit the disclosure, the terms Iref1 and Iref2 current sources may refer to current sources included as part of the PA, as illustrated with respect to PA 100 in FIG. 2, and/or may refer to current sources included in the controller 310 that can supply current to the Iref1 and Iref2 lines as illustrated with respect to the PA 300 in FIG. 3.

In some cases, the current supplied or generated by the Iref1 and Iref2 current sources may be equal. Alternatively, the current supplied or generated by the Iref1 and Iref2 current sources may differ. In some cases, the value of the Iref1 and Iref2 current sources may be related. For example, each of the current sources may be a portion or fraction of a total current generated based on the Vramp signal. Thus, Iref1 may be 33% of the current generated based on the Vramp signal, and Iref2 may be 67% of the current generated based on the Vramp signal. In other cases, although the current supplied or generated by the Iref1 and Iref2 current sources may both relate to the Vramp signal, they may be unrelated to each other.

Whether the PA 300 operates in linear mode or saturated mode may be based on a signal received at the mode input or mode selector 318 of the controller 310. The mode signal may be received from any component of a wireless device that may specify an operating mode of the PA 300. For example, the mode signal may be received from a baseband subsystem, a transceiver, a power management system, etc. In some cases, the mode may be selected based on a signal received from an antenna. Further, in some cases, the signal received at the mode input 318 may not specify a mode of operation of the PA 300, but may instead be used by the controller 310 to determine the mode for the PA 300. Moreover, the signal received at the mode input 318 may be one factor among several used to set the operating mode of the PA 300.

Based on the mode determined by the controller 310, the controller 310 may configure the current mode controller 312 and the voltage to current converter 314. For example, if the controller 310 determines, based at least in part on the signal received at the mode input 318, that the PA 300 is to operate in a saturated mode, the controller 310 may cause the current mode controller 312 to provide a voltage to the voltage input 210. Continuing the above example, the controller 310 may cause the voltage to current converter 314 to set the current for the Iref1 and Iref2 current sources to zero. The voltage to current converter 314 may open a switch or configure a variable current source such that no current is supplied by the Iref1 and Iref2 current sources.

As another example, if the controller 310 determines, based at least in part on the signal received at the mode input 318, that the PA 300 is to operate in a linear mode, the controller 310 may cause the current mode controller 312 to not provide a voltage to the voltage input 210. For instance, the current mode controller 312 may float or ground the voltage input 210. Floating or grounding the voltage input 210 may include opening a switch, or changing a position of the switch. Continuing the above example, the controller 310 may cause the voltage to current converter 314 to set the current for the Iref1 and Iref2 current sources. As previously stated, one or more of the currents may be based on the Vramp signal.

Example Current Sense Mirror Configuration

Figure 4:
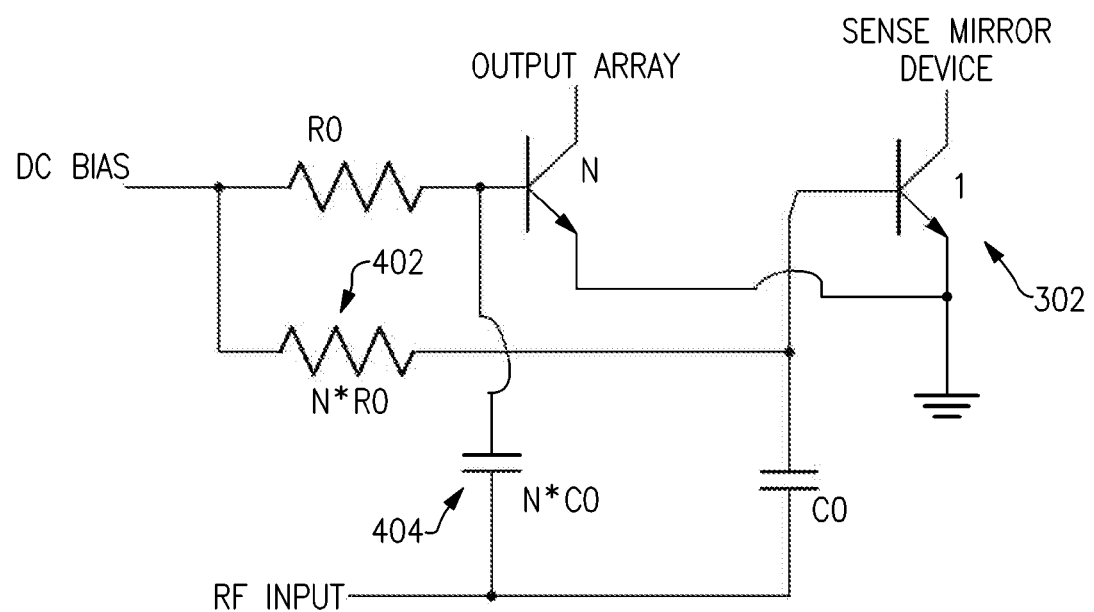
FIG. 4 illustrates an embodiment of a current sense mirror in electrical communication with an output array of a multi-mode power amplifier.

FIG. 4 illustrates an embodiment of a current sense mirror 302 in electrical communication with an output array of a multi-mode power amplifier (e.g., the multi-mode power amplifier 300). Further, the current sense mirror 302 may be in electrical communication with both a DC bias path and a radio frequency (RF) input path.

As illustrated, the current sense mirror 302 may be a fraction of the size of the output array. In the example of FIG. 4, the current sense mirror 302 is 1/N the size of the output array transistor. However, other embodiments are possible. Typically, although not necessarily, the current sense mirror 302 is several times smaller than the output array transistor. For example, in some cases, N may equal 64 and thus the current sense mirror 302 may be $1/64^{th}$ the size of the output array transistor. Further, a bias resistor 402 between the DC bias path and the current sense mirror 302 and an RF coupling capacitor 404 between the RF input and the output array may also be scaled by the factor of N.

Advantageously, in certain embodiments, the scaling and topology of the current sense mirror in relation to the output array results in a current of the current sense mirror 302 equaling 1/N times the current output by the output array. In some embodiments, the current of the current sense mirror 302 may be substantially or approximately 1/N times the current output by the output array within a threshold degree of error. This threshold degree of error may include any degree of error selected by a user or manufacturer. In some cases, the sensing error may be maintained at 0.5 db or less, or less than 6%. Thus, in some cases, the current of the current sense mirror 302 may be within 0.5 dB of 1/N times the current output by the output array. Thus, in certain embodiments, by determining the current of the current sense mirror 302, it is possible to sense the current of the output array. The sensed current of the output array may be used by a controller (e.g., the saturated mode PA controller 312) to set or determine a voltage applied to the PA (e.g., at the voltage input 210).

Example Wireless Device

Figure 5:
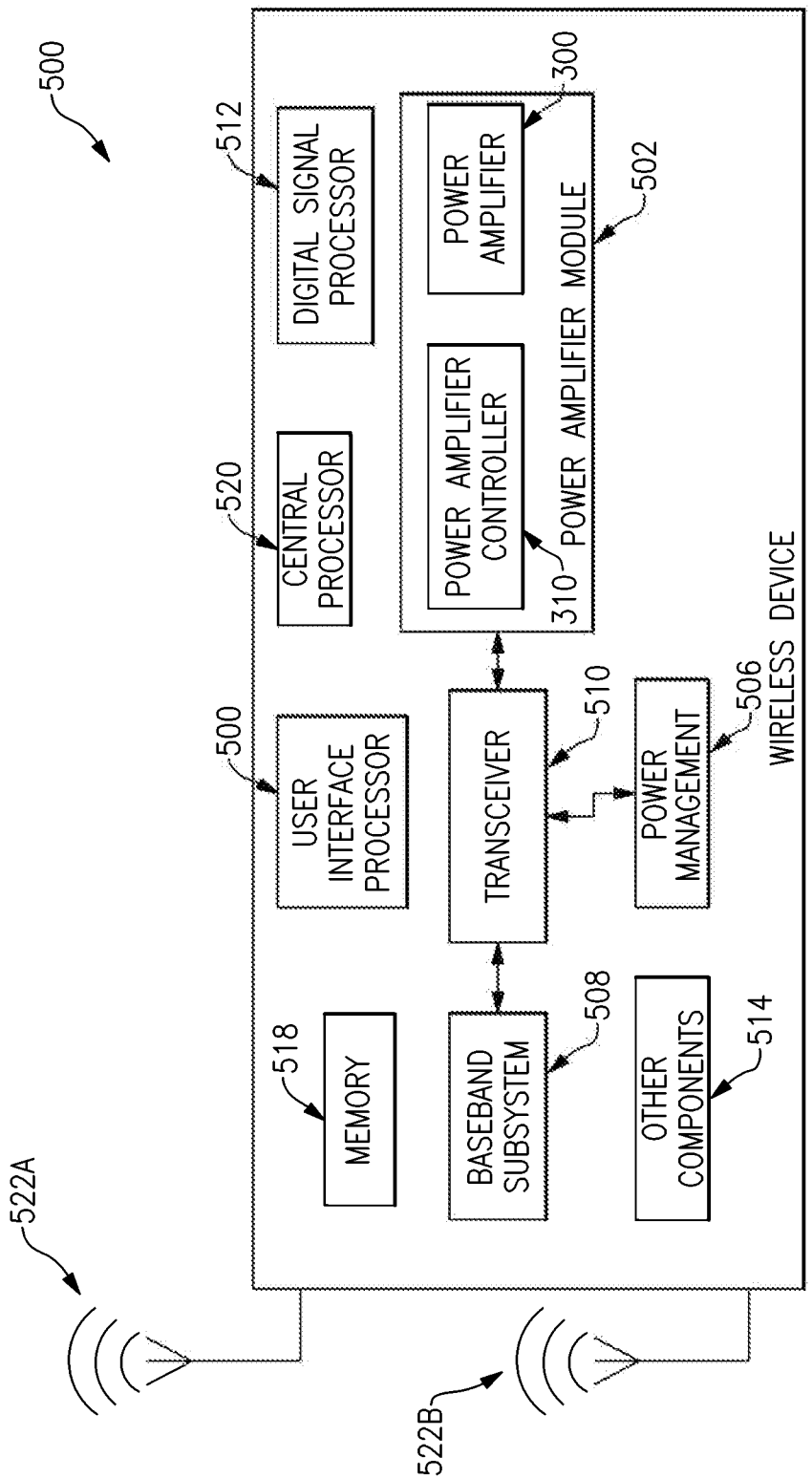
FIG. 5 illustrates an embodiment of a wireless device that may include a multi-mode power amplifier.

FIG. 5 illustrates an embodiment of a wireless device 500 that may include a multi-mode power amplifier 300. Although the wireless device 500 is depicted as including the PA 300, it is possible for the wireless device 500 to include the PA 100 instead. Further, although FIG. 5 illustrates only one PA, it is possible for the wireless device 500 to include a number of PAs, each of which may or may not be of the same configuration as PA 100 or 300.

The PA 300 may be part of a power amplifier module (PAM) 502 that may include a power amplifier controller 310. Alternatively, the PAM 502 may include any other power amplifier controller that may be used to set and/or configure the PA of the PAM 502. In some cases, the power amplifier controller 310 may be omitted. For example, the power amplifier 300 may include the power amplifier controller 310 on chip or integrated with the power amplifier 300. In some embodiments, the PAM 502 may include multiple PAs, which may share the PA controller 310 or which may each be associated with its own power amplifier controller. The PA 300 can facilitate, for example, multi-band operation of the wireless device 500. The mode of the power amplifier 300 may, in some cases, be set by the power amplifier controller 310 based on a signal and/or mode selection set by the power amplifier module 502 or from a transceiver 510.

The PA 300 can receive RF signals from a transceiver 510 that can be configured and operated in known manners to generate RF signals to be amplified and transmitted, and to process received signals. The transceiver 510 is shown to interact with a baseband subsystem 508 that is configured to provide conversion between data and/or voice signals suitable for a user and RF signals suitable for the transceiver 510. The transceiver 510 may also be connected to a power management component 506 that is configured to manage power for the operation of the wireless device. Such power management can also control operations of the baseband subsystem 508 and the PAM 502.

Other connections between the various components of the wireless device 500 are possible, and are omitted from FIG. 5 for clarity of illustration only and not to limit the disclosure. For example, the power management component 506 may be electrically connected to the baseband subsystem 508, the PAM 502, the DSP 512, or other components 514. As a second example, the baseband subsystem 508 may be connected to a user interface processor 516 that may to facilitate various input and output of voice and/or data provided to and received from the user. The baseband sub-system 508 can also be connected to a memory 518 that may be configured to store data and/or instructions to facilitate the operation of the wireless device 500, and/or to provide storage of information for the user.

In addition to the aforementioned components, the wireless device may include one or more central processors 520. Each central processor 520 may include one or more processor cores. Further, the wireless device may include one or more antennas 522A, 522B. In some cases, one or more of the antennas of the wireless device 500 may be configured to transmit and receive at different frequencies or within different frequency ranges. Further, one or more of the antennas may be configured to work with different wireless networks. Thus, for example, the antenna 522A may be configured to transmit and receive signals over a 2G network, and the antenna 522B may be configured to transmit and receive signals over a 3G network. In some cases, the antenna 522A and 522B may both be configured to transmit and receive signals over, for example, a 2.5G network, but at different frequencies.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. Further, the wireless device 500 may include any number of additional components, such as analog to digital converters, digital to analog converters, graphical processing units, solid state drives, etc. Moreover, the wireless device 500 can include any type of device that may communicate over one or more wireless device and that may include a PA 300. For example, the wireless device 500 may be a cellular phone, including a smartphone or a dumbphone, a tablet, a laptop, a video game device, a smart appliance, etc.

Although portions of the present disclosure present a dual-mode power amplifier that includes two bias circuits, the disclosure is not limited as such. For example, the PAs presented herein may include more than two modes. For instance, the PAs may include a saturated mode and two linear modes with each linear mode causing the PA to operate in a different linear region. Further, in some embodiments, the PAs may include more than two bias circuits. In some cases, each mode of the PA may be associated with its own bias circuit. Alternatively, at least some of the modes may share a bias circuit. And, in some such cases, the bias circuit may be configured or operated differently based on the operating mode. For instance, a different voltage or current may be applied to a bias circuit based on the operating mode of the PA.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module comprising:
a power amplifier including a set of transistor stages and a plurality of bias circuits, at least one transistor stage from the set of transistor stages in electrical communication with a first bias circuit and a second bias circuit from the plurality of bias circuits, the first bias circuit configured to apply a first bias voltage to the at least one transistor stage and the second bias circuit configured to apply a second bias voltage to the at least one transistor stage, the plurality of bias circuits further including a third bias circuit and a fourth bias circuit, the third bias circuit configured to apply a different bias voltage than the first bias circuit and the fourth bias circuit configured to apply a different bias voltage than the second bias circuit, the third bias circuit and the fourth bias circuit in electrical communication with a different transistor stage from the set of transistor stages than the first bias circuit and the second bias circuit; and
a controller configured to activate one of the first bias circuit and the second bias circuit.

2. The power amplifier module of claim 1 wherein the first bias circuit is associated with a first impedance and the second bias circuit is associated with a second impedance.

3. The power amplifier module of claim 1 wherein the first bias circuit causes the power amplifier to operate in a saturated mode when the first bias circuit is activated.

4. The power amplifier module of claim 3 wherein the controller is further configured to activate the first bias circuit by applying a voltage to the first bias circuit.

5. The power amplifier module of claim 4 wherein the voltage supplied to the first bias circuit is based at least in part on a voltage received at the controller.

6. The power amplifier module of claim 1 wherein the second bias circuit causes the power amplifier to operate in a linear mode when the second bias circuit is activated.

7. The power amplifier module of claim 6 wherein the controller is further configured to activate the second bias circuit by applying a current to the second bias circuit.

8. The power amplifier module of claim 7 wherein the current supplied to the second bias circuit is based at least in part on a voltage received at the controller.

9. The power amplifier module of claim 1 wherein the controller is further configured to select between the first bias circuit and the second bias circuit to activate based on a mode selection signal received at the controller.

10. The power amplifier module of claim 9 wherein the mode selection signal is based at least partially on a signal received from a wireless network.

11. The power amplifier module of claim 1 wherein the controller is further configured to deactivate the first bias circuit by floating an input to the power amplifier associated with the first bias circuit.

12. The power amplifier module of claim 1 wherein the power amplifier further includes a current sense mirror, the current sense mirror configured to provide a current from at least one stage of the set of transistor stages to the controller.

13. The power amplifier module of claim 12 wherein the controller is further configured to select a voltage to apply to the first bias circuit based at least in part on the current received from the current sense mirror.

14. The power amplifier module of claim 1 wherein each transistor stage from the set of transistor stages corresponds to a pair of bias circuits from the plurality of bias circuits.

15. The power amplifier module of claim 14 wherein the pair of bias circuits includes a bias circuit configured to cause the power amplifier to operate in a saturated mode when active and a bias circuit configured to operate in a linear mode when active.

16. A wireless device comprising:
a transceiver configured to process radio frequency (RF) signals;
an antenna in communication with the transceiver, the antenna configured to facilitate communicating with a wireless network; and
a power amplifier module including a power amplifier and a controller, the power amplifier including a set of transistor stages and a plurality of bias circuits, at least one transistor stage from the set of transistor stages in electrical communication with a first bias circuit and a second bias circuit from the plurality of bias circuits, the first bias circuit configured to apply a first bias voltage to the at least one transistor stage and the second bias circuit configured to apply a second bias voltage to the at least one transistor stage, the plurality of bias circuits further including a third bias circuit and a fourth bias circuit, the third bias circuit configured to apply a different bias voltage than the first bias circuit and the fourth bias circuit configured to apply a different bias voltage than the second bias circuit, the third bias circuit and the fourth bias circuit in electrical communication with a different transistor stage from the set of transistor stages than the first bias circuit and the second bias circuit, and the controller configured to activate one of the first bias circuit or the second bias circuit.

17. The wireless device of claim 16 wherein the controller selects one of the first bias circuit and the second bias circuit to activate based at least in part on a signal received from the transceiver.

18. The wireless device of claim 16 wherein the controller selects one of the first bias circuit and the second bias circuit to activate based at least in part on a type of the wireless network.

19. The wireless device of claim 16 wherein the first bias circuit corresponds to a first impedance level and the second bias circuit corresponds to a second impedance level.

20. The wireless device of claim 16 wherein the controller is further configured to deactivate one of the first bias circuit or the second bias circuit.

21. The wireless device of claim 20 wherein the controller deactivates the one of the first bias circuit or the second bias circuit by floating an input to the power amplifier associated with the one of the first bias circuit or the second bias circuit.

22. The wireless device of claim 16 wherein the power amplifier further includes a current sense mirror, the current sense mirror configured to provide a current from at least one stage of the set of transistor stages to the controller.

* * * * *